(12) United States Patent
Tseng et al.

(10) Patent No.: US 12,385,947 B2
(45) Date of Patent: Aug. 12, 2025

(54) DIRECT LIQUID COOLING SYSTEM FOR ELECTRONIC DEVICES IN SOCKETS, METHOD, AND ELECTRONIC DEVICE TESTING APPARATUS COMPRISING THE SAME

(71) Applicant: CHROMA ATE INC., Taoyuan (TW)

(72) Inventors: I-Shih Tseng, Taoyuan (TW); Chin-Yi Ouyang, Taoyuan (TW); I-Ching Tsai, Taoyuan (TW); Xin-Yi Wu, Taoyuan (TW); Yan-Lin Wu, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 218 days.

(21) Appl. No.: 18/327,148

(22) Filed: Jun. 1, 2023

(65) Prior Publication Data

US 2023/0400478 A1 Dec. 14, 2023

(30) Foreign Application Priority Data

Jun. 10, 2022 (TW) .................................. 111121596

(51) Int. Cl.
*G01R 1/04* (2006.01)
(52) U.S. Cl.
CPC .................................. *G01R 1/0458* (2013.01)
(58) Field of Classification Search
CPC ............ G01R 31/2874; G01R 31/2891; G01R 31/2875; G01R 31/2893; G01R 31/2877;
(Continued)

(56) References Cited

U.S. PATENT DOCUMENTS 6,064,217 A * 5/2000 Smith ................ G01R 1/06744
324/750.25
9,353,995 B2 * 5/2016 Wu ........................ H01L 23/473
(Continued)

FOREIGN PATENT DOCUMENTS

CN 104237767 A 12/2014
CN 113227805 A 8/2021
(Continued)

OTHER PUBLICATIONS

Notification for the Opinion of Examination (including the Search Report) and Decision on Examination respectively issued Mar. 13, 2023 Jul. 11, 2023 in Taiwan application No. 111121596.
(Continued)

*Primary Examiner* — Vinh P Nguyen
(74) *Attorney, Agent, or Firm* — McClure, Qualey & Rodack, LLP (57) ABSTRACT

A liquid cooling system, a liquid cooling method, and an electronic device-testing apparatus having the system are disclosed. When an electronic device is accommodated in a chip slot of a test socket, a cooling liquid supply device supplies a cooling liquid to the chip slot through a fluid inlet portion, and the cooling liquid at least flows over parts of the upper and lower surfaces of the electronic device and then flows out from a fluid outlet portion. The chip slot of the test socket serves as the flow space for the cooling liquid so that the cooling liquid can flow over the upper and lower surfaces of the electronic device, and the electronic device can be immersed in the continuously flowing cooling liquid. The flowing cooling liquid can also take away foreign matter, avoiding the influence of the foreign matter on the test.

6 Claims, 5 Drawing Sheets

(58) Field of Classification Search
CPC ............... G01R 31/2896; G01R 31/26; G01R 31/2862; G01R 31/2808; G01R 31/2865; G01R 1/0483; G01R 31/00; G01R 1/045; G01R 1/06727; G01R 31/2851; G01R 31/2849; G01R 31/2817; G01R 1/0491; G01R 31/2642; G01R 31/307; G01R 31/003; G01R 31/3646; G01R 1/0433; G01N 33/48707

See application file for complete search history.

(56) References Cited

U.S. PATENT DOCUMENTS

| | | | |
|---|---|---|---|
| 10,520,528 B2 * | 12/2019 | Wu | G01R 31/2881 |
| 11,930,618 B2 * | 3/2024 | Chen | H05K 7/2039 |
| 12,032,000 B2 * | 7/2024 | Nguyen | G01R 31/2877 |
| 12,101,914 B2 * | 9/2024 | Chen | H05K 7/20781 |
| 2014/0103947 A1 | 4/2014 | Phan et al. | |
| 2023/0400506 A1 * | 12/2023 | Ouyang | G01R 31/2874 |

FOREIGN PATENT DOCUMENTS

| | | |
|---|---|---|
| TW | 200741229 A | 11/2007 |
| TW | 201250264 A | 12/2012 |

OTHER PUBLICATIONS

Official Notification & Search Report issued Mar. 6, 2023 in corresponding PCT application No. PCT/CN2022/098107.

\* cited by examiner

DIRECT LIQUID COOLING SYSTEM FOR ELECTRONIC DEVICES IN SOCKETS, METHOD, AND ELECTRONIC DEVICE TESTING APPARATUS COMPRISING THE SAME

FIELD OF THE INVENTION

The present invention relates to a system and a method suitable for cooling an electronic device and a testing apparatus when the electronic device is being tested, and an electronic device-testing apparatus having the system.

DESCRIPTION OF THE PRIOR ART

In the traditional electronic device-testing technology, a temperature controller is generally disposed on a pressing head, and the pressing head is brought into contact with a chip so that the chip can be heated or cooled by the temperature controller, as shown in U.S. Pat. No. 6,993,922B2 entitled "Apparatus and Method for Temperature Control of an Electronic Device under Test".

Since the material of the chip has a thermal resistance, the high temperature generated by the chip during a test process may cause a significant temperature difference in the thickness direction of the chip. For a low-temperature test, in the case that the test power of the chip is 1000 W, if the temperature controller of the pressing head is set to a test environment of −40° C., the lower surface of the chip may reach −5° C., resulting in a considerable temperature difference. Such a temperature difference is easy to affect the accuracy of the test.

Currently, packaging technology is progressing from 2D and 2.5D packaging towards 3D packaging. In the currently well-known 2.5D packaging technology such as TSMC's CoWoS, multiple semiconductor chips (such as processors, memories, etc.) are disposed on a silicon interposer and then connected to an underlying substrate by a Chip on Wafer (CoW) packaging process.

Figure 1A:
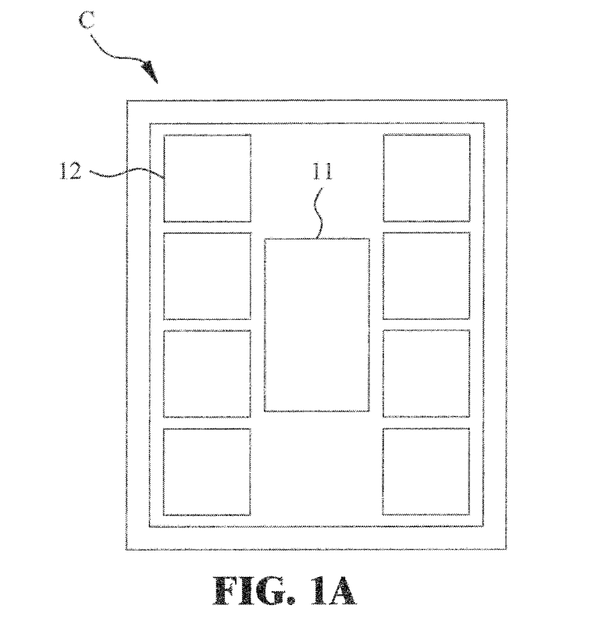
FIG. 1A is a schematic top view of an electronic device of a 2.5D package.
Figure 1B:
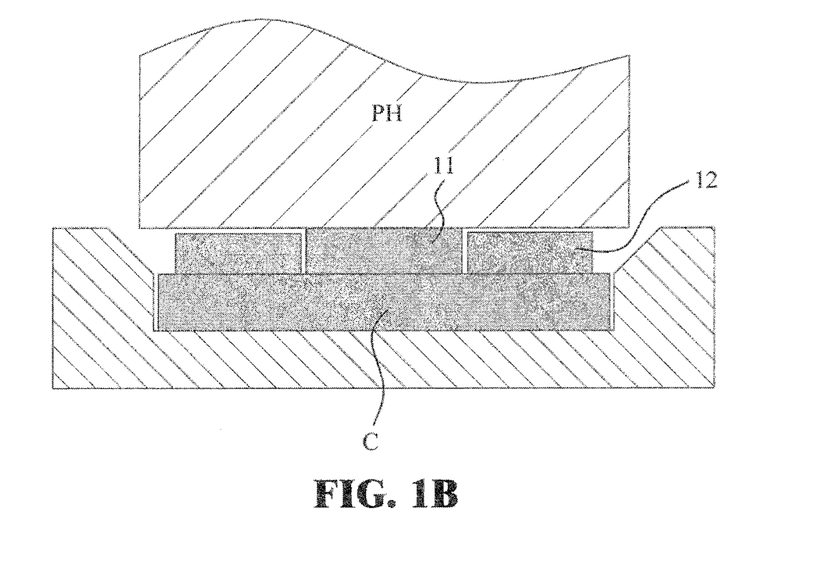
FIG. 1B is a cross-sectional view of the electronic device of a 2.5D package in a test state.

Reference is made to FIG. 1A and FIG. 1B. FIG. 1A is a schematic top view of an electronic device of a 2.5D package, and FIG. 1B is a cross-sectional view of the electronic device of the 2.5D package in a test state. As shown in the figure, the electronic device C of the 2.5D package is provided with a processor die 11 and a memory die 12. A pressing head PH can be brought into contact with only the thicker die during the execution of a test since the processor die and the memory die have different thicknesses. Therefore, the contact area is greatly reduced, resulting in poor heat conduction efficiency, a larger temperature difference, and greatly affecting the accuracy of the test.

As such, a liquid cooling system, a liquid cooling method, and an electronic device-testing apparatus having the system suitable for an electronic device of a 2.5D package or a 3D package and capable of completely controlling the temperature of at least an upper surface and a lower surface of the electronic device for achieving an excellent cooling effect are highly expected in the industry.

SUMMARY OF THE INVENTION

The main object of the present invention is to provide a liquid cooling system, a liquid cooling method, and an electronic device-testing apparatus having the system capable of completely controlling the temperature of at least an upper surface and a lower surface of an electronic device, immersing the electronic device under test in a cooling liquid and providing a constant temperature test environment with the cooperation of a pressing head for achieving an excellent temperature control effect.

To achieve the above object, the present application provides a liquid cooling system, which mainly comprises a test socket and a cooling liquid supply device. The test socket includes a chip slot, which has a fluid inlet portion and a fluid outlet portion on an internal peripheral wall of the chip slot; and the cooling liquid supply device can be communicated with the fluid inlet portion of the test socket. When an electronic device is accommodated in the chip slot of the test socket, the cooling liquid supply device supplies a cooling liquid to the chip slot through the fluid inlet portion, and the cooling liquid at least flows over parts of the upper surface and the lower surface of the electronic device and then flows out from the fluid outlet portion.

Accordingly, the chip slot of the test socket of the liquid cooling system of the present invention is used as a flow space for the cooling liquid so that the cooling liquid can at least flow over the upper surface and the lower surface of the electronic device, and the electronic device is immersed in the continuously flowing cooling liquid, thereby achieving an excellent cooling effect. The flowing cooling liquid can also take away dust, solder scrap, or other foreign matter, avoiding the influence of the foreign matter on the test, such as short circuits of contacts or probes.

To achieve the above object, the present invention provides a liquid cooling method for at least cooling an electronic device, which is accommodated in a chip slot of a test socket. The liquid cooling method comprises the steps of: supplying a cooling liquid to the chip slot through a fluid inlet portion of the chip slot by a cooling liquid supply device; making the cooling liquid at least flow over parts of the upper surface and the lower surface of the electronic device; and making the cooling liquid flow out from a fluid outlet portion of the chip slot.

According to the liquid cooling method provided by the present invention, the cooling liquid is forced to at least flow over parts of the upper surface and the lower surface of the electronic device so that the continuously flowing cooling liquid can exchange heat with the surfaces of the chip, thereby achieving an excellent cooling effect and keeping the chip slot and the electronic device clean.

To achieve the above object, the present invention provides an electronic device-testing apparatus for testing an electronic device, which includes a substrate and at least one semiconductor component arranged on an upper surface of the substrate. The electronic device-testing apparatus comprises the liquid cooling system as described above and a pressing head, wherein when the electronic device is tested, a lower surface of the pressing head is abutted against the semiconductor component of the electronic device; a flow space is defined by the lower surface of the pressing head and the chip slot; the cooling liquid supply device supplies the cooling liquid to the flow space through the fluid inlet portion.

In contrast to traditionally cooling an electronic device by bringing a pressing head into contact with the electronic device, the electronic device-testing apparatus of the present invention adopts the pressing head and the liquid cooling system as cooling means, wherein the flow space formed by the pressing head and the chip slot is used to accommodate the cooling liquid and allows the cooling liquid to flow continuously so that the electronic device can be immersed in the cooling liquid, thereby creating an excellent constant temperature test environment.

DETAILED DESCRIPTION OF THE INVENTION

Before a liquid cooling system, a liquid cooling method, and an electronic device-testing apparatus having the system according to the present invention are described in detail in embodiments, it should be noted that in the following description, similar components will be designated by the same reference numerals. Furthermore, the drawings of the present invention are for illustrative purposes only, they are not necessarily drawn to scale, and not all details are necessarily shown in the drawings. The testing apparatus used in the present invention includes, but is not limited to: a semiconductor chip-testing apparatus, a system-level automatic testing apparatus, and the like.

Figure 2:
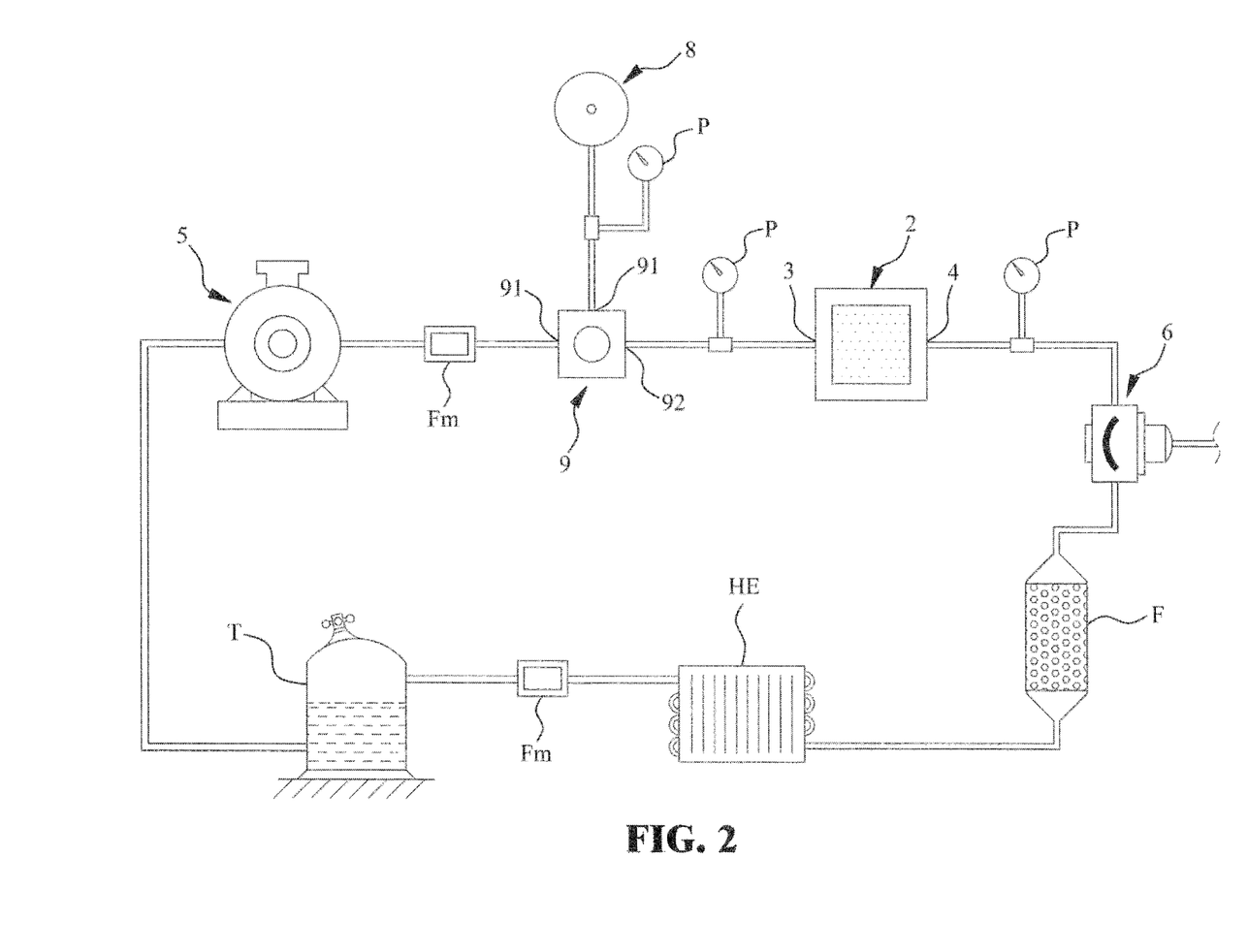
FIG. 2 is a schematic arrangement diagram of a liquid cooling system according to a preferred embodiment of the present invention.
Figure 3:
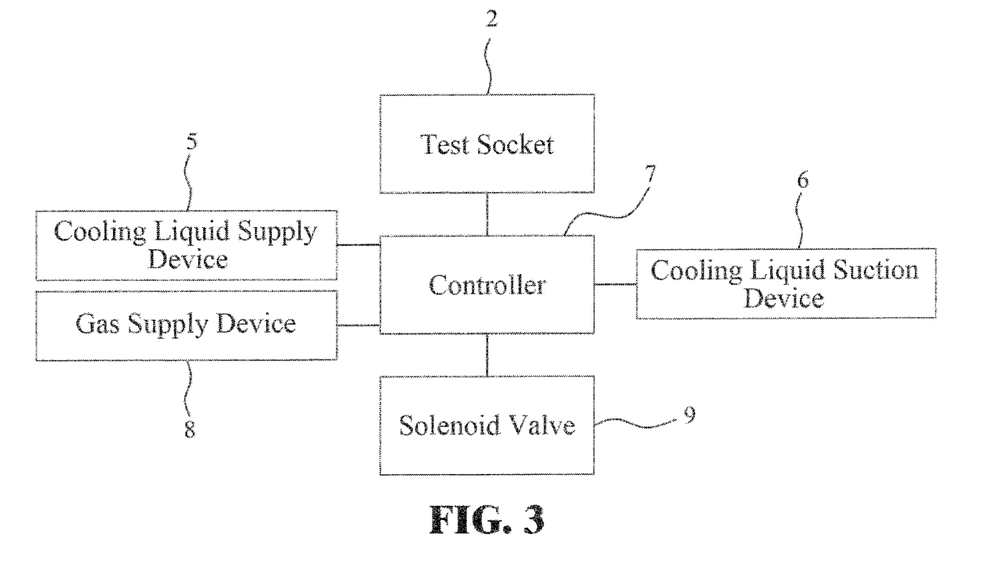
FIG. 3 is an architecture diagram of the liquid cooling system according to a preferred embodiment of the present invention.

Reference is made to FIG. 2 and FIG. 3. FIG. 2 is a schematic arrangement diagram of a liquid cooling system according to a preferred embodiment of the present invention, and FIG. 3 is an architecture diagram of the liquid cooling system according to a preferred embodiment of the present invention. The liquid cooling system of this embodiment mainly includes a test socket 2, a cooling liquid supply device 5, a cooling liquid pumping device 6, a controller 7, a gas supply device 8, a solenoid valve 9, a filter module F, a heat exchange module HE, and a cooling liquid storage tank T. The test socket 2, the cooling liquid supply device 5, the cooling liquid pumping device 6, the gas supply device 8, and the solenoid valve 9 are electrically connected to the controller 7. The solenoid valve 9 includes two inlet ports 91 and an outlet port 92, the cooling liquid supply device 5 and the gas supply device 8 are communicated with the two inlet ports 91, respectively, and the outlet port 92 is communicated with the test socket 2.

In this embodiment, a cooling liquid circulation loop is formed by the cooling liquid supply device 5, the solenoid valve 9, the test socket 2, the cooling liquid pumping device 6, the filter module F, the heat exchange module HE, and the cooling liquid storage tank T. After a cooling liquid is supplied to the test socket 2 from the cooling liquid supply device 5 through the electromagnetic valve 9, the cooling liquid pumping device 6 is used to pump the cooling liquid from the test socket 2 so that the cooling liquid is forced to flow through the filter module F and the heat exchange module HE and then stored in the cooling liquid storage tank T. The filter module F is used to filter out foreign matter in the cooling liquid, such as solder scraps or dust. The heat exchange module HE is used to adjust the temperature of the cooling liquid, for example, to cool the cooling liquid.

In the cooling liquid circulation loop of this embodiment, three pressure gauges P for monitoring the fluid pressure are respectively provided at the upstream and downstream of the test socket 2 and the downstream of the gas supply device 8, and two flow meters Fm for monitoring the flow rate of the cooling liquid are respectively provided at the downstream of the cooling liquid supply device 5 and the upstream of the cooling liquid storage tank T. By means of the pressure gauges P and the flow meters Fm, the presence or absence of leakage or blockage of the cooling liquid can be determined. The cooling liquid pumping device 6 of this embodiment is a diaphragm pump which has a good self-priming ability. The cooling fluid in this embodiment is a non-conductive heat conduction liquid, such as 3M™ Novec™ engineered fluid.

Figure 4A:
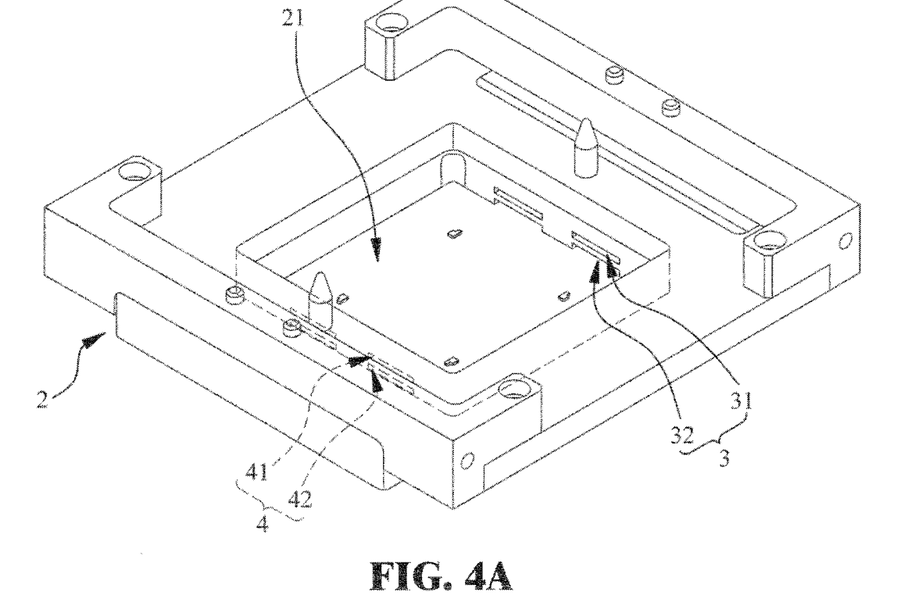
FIG. 4A is a perspective view of a test socket according to a first embodiment of the present invention.
Figure 4B:
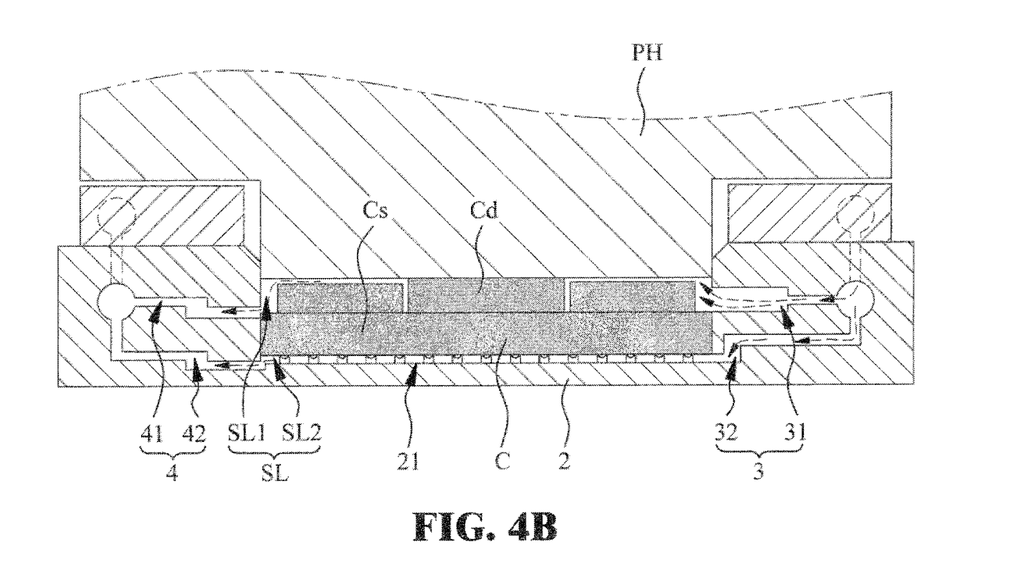
FIG. 4B is a cross-sectional view of the first embodiment of the present invention in a test state.

Reference is made to FIG. 4A and FIG. 4B. FIG. 4A is a perspective view of a test socket according to a first embodiment of the present invention, and FIG. 4B is a cross-sectional view of the first embodiment of the present invention in a test state. As shown in the figures, the test socket 2 includes a chip slot 21, which has a fluid inlet portion 3 and a fluid outlet portion 4 on an internal peripheral wall of the chip slot 21. The fluid inlet portion 3 of this embodiment includes two upper fluid inlet holes 31 and two lower fluid inlet holes 32. The fluid outlet portion 4 includes two upper fluid outlet holes 41 and two lower fluid outlet holes 42. When an electronic device C is accommodated in the chip slot 21, the two upper fluid inlet holes 31 and the two upper fluid outlet holes 41 correspond to the upper surface of the electronic device C, and the two lower fluid inlet holes 32 and the two lower fluid outlet holes 42 correspond to the lower surface of the electronic device C.

In this embodiment, the upper fluid outlet holes 41 are arranged slightly lower than the upper surface of the electronic device C in the height direction, and the lower fluid outlet holes 42 are arranged slightly lower than the bottom surface of the chip slot 21 in the height direction. Even if the cooling liquid remains on the upper surface of the electronic device C or the bottom surface of the chip slot 21, the cooling liquid would flow into the upper fluid outlet holes 41 and the lower fluid outlet holes 42 due to gravity and the siphoning effect. Accordingly, removal of the cooling liquid from the upper surface of the electronic device C and the bottom surface of the chip slot 21 is facilitated.

The operation of the electronic device-testing apparatus of this embodiment will be described later. Reference is made to FIG. 2, FIG. 3, FIG. 4A, and FIG. 4B. In this embodiment, the electronic device C to be tested is a 2.5D package, but the present invention is not limited thereto, and any type of electronic devices can be applied to the present invention. When the electronic device C is to be tested, the electronic device C is placed in the chip slot 21 of the test socket 2, and a lower surface of a pressing head PH is pressed against one of semiconductor components Cd of the electronic device C. At this time, a flow space SL is defined by the lower surface of the pressing head PH and the chip slot 21.

Since said one of the semiconductor components Cd of the electronic device C in contact with the lower surface of the pressing head PH is a higher semiconductor component Cd PH, an upper space SL1 is formed by the upper surface of the substrate Cs of the electronic device C, the lower surface of the pressing head PH, and the internal peripheral wall of the chip slot 21, and a lower space SL2 is formed by the lower surface of the substrate Cs of the electronic device C, the internal peripheral wall of the chip slot 21, and the bottom surface of the chip slot 21.

The controller 7 controls the solenoid valve 9 to allow communication between the cooling liquid supply device 5 and the fluid inlet portion 3 so that the cooling liquid flows into the chip slot 21 from the upper fluid inlet holes 31 and the lower fluid inlet holes 32 of the fluid inlet portion 3. At the same time, the controller 7 controls the cooling liquid pumping device 6 to pump the cooling liquid from the chip slot 21 through the upper fluid outlet holes 41 and the lower fluid outlet holes 42 of the fluid outlet portion 4. Accordingly, the cooling liquid is forced to flow through the upper space SL1 and the lower space SL2.

In the upper space SL1, the cooling liquid flows over the upper surface of the substrate Cs and a part of the semiconductor components Cd. In the lower space SL2, the cooling liquid flows over the lower surface of the substrate Cs, the lower half of the chip slot 21, probes and other components. Therefore, in a test process, the cooling liquid not only regulates the temperature of the electronic device C by removing the heat generated by the electronic device C but also takes away foreign matters remaining in the chip slot 21 or on the electronic device C, such as solder scraps or dust to ensure the cleanliness of the chip slot 21 and the electronic device C.

After the electronic device C is tested, the controller 7 controls the solenoid valve 9 to allow communication between the gas supply device 8 and the fluid inlet portion 3 and supply gas to the chip slot 21 so that the cooling liquid remaining in the chip slot 21 or on the electronic device is forced into the fluid outlet portion 4. At this time, the cooling liquid pumping device 6 is still in operation and continuously pumps the cooling liquid, thereby ensuring that the cooling liquid can be completely drawn from the chip slot 21.

Figure 5A:
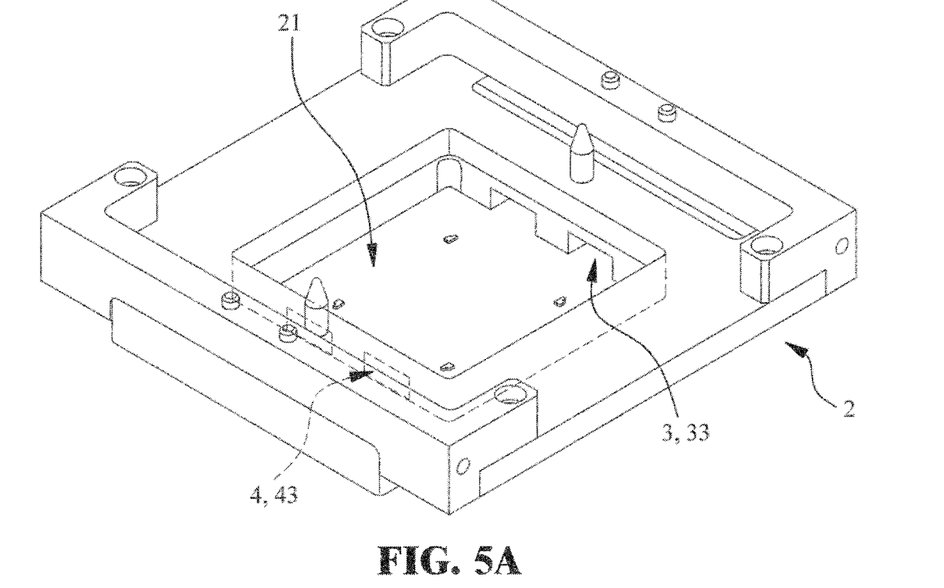
FIG. 5A is a perspective view of the test socket according to a second embodiment of the present invention.
Figure 5B:
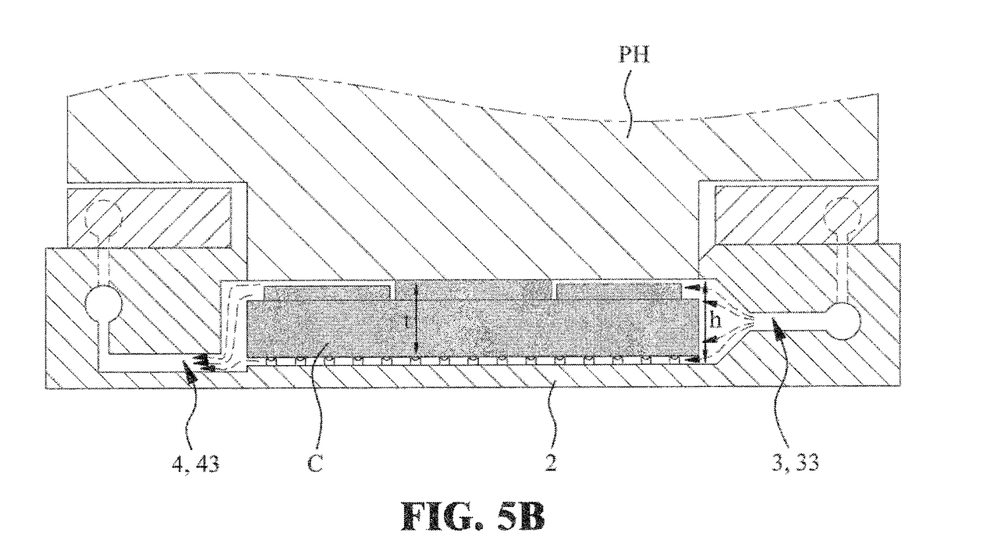
FIG. 5B is a cross-sectional view of the second embodiment of the present invention in a test state.

Reference is made to FIG. 5A and FIG. 5B. FIG. 5A is a perspective view of the test socket according to a second embodiment of the present invention, and FIG. 5B is a cross-sectional view of the second embodiment of the present invention in a test state. The main difference between the second embodiment and the first embodiment lies in the arrangement of the fluid inlet portion 3 and the fluid outlet portion 4. In this embodiment, the fluid inlet portion 3 includes two liquid inlets 33, the fluid outlet portion 4 includes two liquid outlets 43, and each of the liquid inlets 33 and the liquid outlets 43 has a height h greater than the thickness t of the electronic device C. In other words, in this embodiment, in the thickness direction, the liquid inlets 33 and the liquid outlets 43 cover the entire electronic device C.

In the first embodiment, the cooling liquid flows through the chip slot in form of an upper flow and a lower flow, but in the second embodiment, a flow space for the upper flow and a flow space for the lower flow are not distinctly defined so that the cooling liquid can flow over the upper and lower surfaces and the outer circumferential surface of the electronic device C. Accordingly, the surface area of the electronic device for heat exchange is significantly increased in the second embodiment, resulting in improvement of heat exchange efficiency.

As can be seen from above, the present invention at least has the following advantages:

(1) The temperature of the upper and lower surfaces of the electronic device can be controlled with the cooperation of the pressing head, and the electronic device under test is immersed in the cooling fluid of a constant temperature, thereby achieving an excellent temperature control effect.

(2) The cooling liquid can flow in separate layers over at least the upper and lower surfaces of the electronic device or flow over the entire electronic device so that the entire surface area of the electronic device is nearly provided for exchanging heat with the continuously flowing cooling liquid, resulting in an excellent cooling effect.

(3) The flowing cooling liquid is capable of taking away dust, solder scraps, or other foreign matter, preventing the foreign matter from affecting the test (for example causing short circuits of contacts or probes), and keeping the chip slot and the electronic device clean.

(4) During the test process, the cooling liquid is supplied to the test socket by the cooling liquid supply device and pumped from the test socket by the cooling liquid pumping device so as to form a forced flow of the cooling liquid. Additionally, since the cooling liquid flows at a specific flow rate in the chip slot, the liquid pressure in the chip slot is lower than the atmospheric pressure so that risk of leakage of the cooling liquid is very low.

(5) After the test is completed, gas is supplied to the chip slot by the gas supply device, and the cooling liquid pumping device still continues to pump the cooling liquid from the chip slot so as to ensure that the cooling liquid can be completely drawn from the chip slot.

(6) The fluid outlet portion is arranged slightly lower than the upper surface of the electronic device or the bottom surface of the chip slot in the height direction for facilitating removal of the cooling liquid from the upper surface of the electronic device or the bottom surface of the chip slot. Even if the cooling liquid remains on the upper surface of the electronic device C or the bottom surface of the chip slot, the cooling liquid would flow into the fluid outlet portion due to the gravity and the siphon effect.

The preferred embodiments of the present invention are illustrative only, and the claimed inventions are not limited to the details disclosed in the drawings and the specification. Accordingly, it is intended that it have the full scope permitted by the language of the following claims.

The invention claimed is:

1. A direct liquid cooling system for an electronic device in a socket, comprising:
  a chip slot disposed in the socket, the chip slot having at least one upper fluid inlet hole, at least one lower fluid inlet hole, at least one upper fluid outlet hole and at least one lower fluid outlet hole disposed on an internal peripheral wall of the chip slot; and
  a cooling liquid supply device, fluidly connected to the at least one upper fluid inlet hole and the at least one lower fluid inlet hole,
  wherein the chip slot is configured to accommodate the electronic device such that, the at least one upper fluid inlet hole and the at least one upper fluid outlet hole are positioned to direct a cooling liquid over an upper surface of the electronic device, and the at least one lower fluid inlet hole and the at least one lower fluid outlet hole are positioned to direct the cooling liquid over a lower surface of the electronic device, and the cooling liquid supply device is configured to supply the cooling liquid through the at least one upper fluid inlet hole and the at least one lower fluid inlet hole to flow over the upper surface and the lower surface of the electronic device, the cooling liquid exiting through the at least one upper fluid outlet hole and the at least one lower fluid outlet hole.

2. The direct liquid cooling system of claim 1, further comprising a cooling liquid pumping device and a controller; the cooling liquid pumping device is communicated with the at least one upper fluid outlet hole and the at least one lower fluid outlet hole; the controller is electrically connected to the socket, the cooling liquid supply device, and the cooling liquid pumping device; when the electronic device is tested, the controller controls the cooling liquid supply device to supply the cooling liquid to the chip slot and controls the cooling liquid pumping device to pump the cooling liquid from the chip slot.

3. The direct liquid cooling system of claim 2, further comprising a gas supply device and a solenoid valve; the gas supply device and the solenoid valve are electrically connected to the controller; the solenoid valve includes two inlet ports and an outlet port; the cooling liquid supply device and the gas supply device are communicated with the two inlet ports respectively, the outlet port is communicated with the at least one upper fluid inlet hole and the at least one lower fluid inlet hole, when the electronic device is tested, the controller controls the solenoid valve so that the cooling liquid supply device is communicated with the at least one upper fluid inlet hole and the at least one lower fluid inlet hole; when testing the electronic device is completed, the controller controls the solenoid valve so that the gas supply device is communicated with the at least one upper fluid inlet hole and the at least one lower fluid inlet hole.

4. An electronic device-testing apparatus for testing an electronic device, the electronic device including a substrate and at least one semiconductor component, the at least one semiconductor component being arranged on an upper surface of the substrate, the apparatus comprising:
the direct liquid cooling system of claim 1; and
a pressing head,
wherein when the electronic device is tested, a lower surface of the pressing head is pressed against the at least one semiconductor component of the electronic device; a flow space is defined by the lower surface of the pressing head and the chip slot, the cooling liquid supply device supplies the cooling liquid to the flow space through the at least one upper fluid inlet hole and the at least one lower fluid inlet hole.

5. The electronic device-testing apparatus of claim 4, wherein the flow space includes an upper space and a lower space; the upper space is defined by the lower surface of the pressing head, the upper surface of the electronic device, and an internal peripheral wall of the chip slot; the lower space is defined by the lower surface of the electronic device, the internal peripheral wall of the chip slot, and a bottom surface of the chip slot; the cooling liquid supply device supplies the cooling liquid to the upper space and the lower space through the at least one upper fluid inlet hole and the at least one lower fluid inlet hole.

6. A direct liquid cooling method for at least cooling an electronic device in a socket, the electronic device being accommodated in a chip slot of the socket, the liquid cooling method comprising:
(A) supplying a cooling liquid to the chip slot through at least one upper fluid inlet hole and at least one lower fluid inlet hole of the chip slot by a cooling liquid supply device;
(B) allowing the cooling liquid from the at least one upper fluid inlet hole to flow over an upper surface of the electronic device, and allowing the cooling liquid from the at least one lower fluid inlet hole to flow over a lower surface of the electronic device; and
(C) allowing the cooling liquid that flows over the upper surface of the electronic device to flow out through at least one upper fluid outlet hole of the chip slot, and allowing the cooling liquid that flows over the lower surface of the electronic device to flow out through at least one lower fluid outlet hole of the chip slot.

\* \* \* \* \*